United States Patent
Winkler

(10) Patent No.: US 9,605,343 B2
(45) Date of Patent: Mar. 28, 2017

(54) METHOD FOR FORMING CONFORMAL CARBON FILMS, STRUCTURES CONFORMAL CARBON FILM, AND SYSTEM OF FORMING SAME

(71) Applicant: ASM IP Holding B.V., Almere (NL)

(72) Inventor: Jereld Lee Winkler, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 8 days.

(21) Appl. No.: 14/079,302

(22) Filed: Nov. 13, 2013

(65) Prior Publication Data

US 2015/0132212 A1   May 14, 2015

(51) Int. Cl.
| | | |
|---|---|---|
| *C01B 31/04* | (2006.01) | |
| *C23C 16/455* | (2006.01) | |
| *C23C 16/01* | (2006.01) | |
| *C23C 16/56* | (2006.01) | |
| *C01B 31/02* | (2006.01) | |
| *C23C 16/32* | (2006.01) | |

(52) U.S. Cl.
CPC .... *C23C 16/45525* (2013.01); *C01B 31/0226* (2013.01); *C23C 16/01* (2013.01); *C23C 16/32* (2013.01); *C23C 16/56* (2013.01); *Y10T 428/30* (2015.01)

(58) Field of Classification Search
CPC ....... C01B 31/30; C01B 31/303; C01B 31/34; C01B 31/0226; C01B 31/0438; C23C 16/01; C23C 16/32; C23C 16/56; C23C 16/45525
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,094,396 A | 6/1963 | Flugge et al. |
| 3,232,437 A | 2/1966 | Hultgren |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

Crowell, John E. "Chemical methods of thin film deposition: Chemical vapor deposition, atomic layer deposition, and related technologies." Journal of Vacuum Science & Technology A 21.5 (2003): S88-S95.*

(Continued)

*Primary Examiner* — Richard M Rump
(74) *Attorney, Agent, or Firm* — Snell & Wilmer L.L.P.

(57) ABSTRACT

Methods of forming carbon films, structures and devices including the carbon films, and systems for forming the carbon films are disclosed. A method includes depositing a metal carbide film using atomic layer deposition (ALD). Metal from the metal carbide film is removed from the metal carbide film to form a carbon film. Because the films are formed using ALD, the films can be relatively conformal and can have relatively uniform thickness over the surface of a substrate.

20 Claims, 5 Drawing Sheets

(56) References Cited

U.S. PATENT DOCUMENTS

| | | | |
|---|---|---|---|
| 4,054,071 A | 10/1977 | Patejak |
| 4,058,430 A | 11/1977 | Suntola et al. |
| 4,145,699 A | 3/1979 | Hu et al. |
| 4,164,959 A | 8/1979 | Wurzburger |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,436,674 A | 3/1984 | McMenamin |
| 4,479,831 A | 10/1984 | Sandow |
| 4,499,354 A | 2/1985 | Hill et al. |
| 4,512,113 A | 4/1985 | Budinger |
| 4,570,328 A | 2/1986 | Price et al. |
| D288,556 S | 3/1987 | Wallgren |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,756,794 A | 7/1988 | Yoder |
| 4,789,294 A | 12/1988 | Sato et al. |
| 4,821,674 A | 4/1989 | deBoer et al. |
| 4,827,430 A | 5/1989 | Aid et al. |
| 4,882,199 A | 11/1989 | Sadoway et al. |
| 4,976,996 A | 12/1990 | Monkowski et al. |
| 4,978,567 A | 12/1990 | Miller |
| 4,984,904 A | 1/1991 | Nakano et al. |
| 4,986,215 A | 1/1991 | Yamada |
| 4,991,614 A | 2/1991 | Hammel |
| 5,013,691 A | 5/1991 | Lory et al. |
| 5,027,746 A | 7/1991 | Frijlink |
| 5,062,386 A | 11/1991 | Christensen |
| 5,065,698 A | 11/1991 | Koike |
| 5,074,017 A | 12/1991 | Toya et al. |
| 5,098,638 A | 3/1992 | Sawada |
| 5,104,514 A | 4/1992 | Quartarone |
| 5,119,760 A | 6/1992 | McMillan et al. |
| 5,130,003 A | 7/1992 | Conrad |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,246,500 A | 9/1993 | Samata et al. |
| 5,271,967 A | 12/1993 | Kramer et al. |
| 5,278,494 A | 1/1994 | Obigane |
| 5,310,456 A | 5/1994 | Kadomura |
| 5,310,698 A | 5/1994 | Wild |
| 5,315,092 A | 5/1994 | Takahashi et al. |
| 5,326,427 A | 7/1994 | Jerbic |
| 5,326,722 A | 7/1994 | Huang |
| 5,336,327 A | 8/1994 | Lee |
| 5,360,269 A | 11/1994 | Ogawa et al. |
| 5,380,367 A | 1/1995 | Bertone |
| 5,413,813 A | 5/1995 | Cruse et al. |
| 5,414,221 A | 5/1995 | Gardner |
| 5,421,893 A | 6/1995 | Perlov |
| 5,422,139 A | 6/1995 | Shinriki et al. |
| 5,518,549 A | 5/1996 | Hellwig |
| 5,577,331 A | 11/1996 | Suzuki |
| 5,595,606 A | 1/1997 | Fujikawa et al. |
| 5,616,947 A | 4/1997 | Tamura |
| 5,621,982 A | 4/1997 | Yamashita |
| 5,632,919 A | 5/1997 | MacCracken et al. |
| 5,681,779 A | 10/1997 | Pasch et al. |
| 5,695,567 A | 12/1997 | Kordina |
| 5,724,748 A | 3/1998 | Brooks |
| 5,730,801 A | 3/1998 | Tepman et al. |
| 5,732,744 A | 3/1998 | Barr et al. |
| 5,736,314 A | 4/1998 | Hayes et al. |
| 5,782,979 A | 7/1998 | Kaneno |
| 5,786,027 A | 7/1998 | Rolfson |
| 5,796,074 A | 8/1998 | Edelstein et al. |
| 5,836,483 A | 11/1998 | Disel |
| 5,837,320 A | 11/1998 | Hampden-Smith et al. |
| 5,852,879 A | 12/1998 | Schumaier |
| 5,855,680 A | 1/1999 | Soininen et al. |
| 5,888,876 A | 3/1999 | Shiozawa et al. |
| 5,920,798 A | 7/1999 | Higuchi et al. |
| 5,979,506 A | 11/1999 | Aarseth |
| 6,013,553 A | 1/2000 | Wallace |
| 6,015,465 A | 1/2000 | Kholodenko et al. |
| 6,017,818 A | 1/2000 | Lu |
| 6,035,101 A | 3/2000 | Sajoto et al. |
| 6,060,691 A | 5/2000 | Minami et al. |
| 6,067,680 A | 5/2000 | Pan et al. |
| 6,074,443 A | 6/2000 | Venkatesh |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,134,807 A | 10/2000 | Komino |
| 6,148,761 A | 11/2000 | Majewski et al. |
| 6,160,244 A | 12/2000 | Ohashi |
| 6,161,500 A | 12/2000 | Kopacz et al. |
| 6,190,634 B1 * | 2/2001 | Lieber ............... B82Y 30/00 423/414 |
| 6,201,999 B1 | 3/2001 | Jevtic |
| 6,204,206 B1 | 3/2001 | Hurley |
| 6,212,789 B1 | 4/2001 | Kato |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| D451,893 S | 12/2001 | Robson |
| D452,220 S | 12/2001 | Robson |
| 6,325,858 B1 | 12/2001 | Wengert |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,383,566 B1 | 5/2002 | Zagdoun |
| 6,410,459 B2 | 6/2002 | Blalock et al. |
| 6,420,279 B1 | 7/2002 | Ono et al. |
| 6,445,574 B1 | 9/2002 | Saw et al. |
| 6,448,192 B1 | 9/2002 | Kaushik |
| 6,454,860 B2 | 9/2002 | Metzner et al. |
| 6,475,276 B1 * | 11/2002 | Elers ............... C23C 16/0272 117/84 |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,552,209 B1 | 4/2003 | Lei et al. |
| 6,569,239 B2 | 5/2003 | Arai et al. |
| 6,578,589 B1 | 6/2003 | Mayusumi |
| 6,579,833 B1 * | 6/2003 | McNallan et al. ............ 508/100 |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,645,304 B2 | 11/2003 | Yamaguchi |
| 6,648,974 B1 | 11/2003 | Ogliari et al. |
| 6,656,281 B1 | 12/2003 | Ueda |
| 6,673,196 B1 | 1/2004 | Oyabu |
| 6,682,973 B1 | 1/2004 | Paton et al. |
| 6,709,989 B2 | 3/2004 | Ramdani et al. |
| 6,710,364 B2 | 3/2004 | Guldi et al. |
| 6,713,824 B1 | 3/2004 | Mikata |
| 6,734,090 B2 | 5/2004 | Agarwala et al. |
| 6,760,981 B2 | 7/2004 | Leap |
| 6,809,005 B2 | 10/2004 | Ranade et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,835,039 B2 | 12/2004 | Van Den Berg |
| 6,847,014 B1 | 1/2005 | Benjamin et al. |
| 6,858,524 B2 | 2/2005 | Haukka et al. |
| 6,858,547 B2 | 2/2005 | Metzner |

(56) References Cited

U.S. PATENT DOCUMENTS

| | | |
|---|---|---|
| 6,861,334 B2 | 3/2005 | Raaijmakers et al. |
| 6,863,019 B2 | 3/2005 | Shamouilian |
| 6,874,247 B1 | 4/2005 | Hsu |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 | 12/2005 | Waite et al. |
| 7,005,391 B2 * | 2/2006 | Min .................. B82Y 30/00 438/758 |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,087,536 B2 | 8/2006 | Nemani et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,157,327 B2 | 1/2007 | Haupt |
| 7,172,497 B2 | 2/2007 | Basol et al. |
| 7,186,648 B1 | 3/2007 | Rozbicki |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,238,596 B2 | 7/2007 | Kouvetakis et al. |
| D553,104 S | 10/2007 | Oohashi et al. |
| 7,288,463 B1 | 10/2007 | Papasouliotis |
| 7,298,009 B2 | 11/2007 | Yan et al. |
| D557,226 S | 12/2007 | Uchino et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,431,966 B2 | 10/2008 | Derderian et al. |
| 7,437,060 B2 | 10/2008 | Wang et al. |
| 7,442,275 B2 | 10/2008 | Cowans |
| 7,489,389 B2 | 2/2009 | Shibazaki |
| 7,494,882 B2 | 2/2009 | Vitale |
| D593,969 S | 6/2009 | Li |
| 7,547,363 B2 | 6/2009 | Tomiyasu et al. |
| 7,575,968 B2 | 8/2009 | Sadaka et al. |
| 7,589,003 B2 | 9/2009 | Kouvetakis et al. |
| 7,601,223 B2 | 10/2009 | Lindfors et al. |
| 7,601,225 B2 | 10/2009 | Tuominen et al. |
| 7,611,751 B2 * | 11/2009 | Elers .................. C23C 16/32 427/249.1 |
| 7,640,142 B2 | 12/2009 | Tachikawa et al. |
| 7,651,583 B2 | 1/2010 | Kent et al. |
| D609,655 S | 2/2010 | Sugimoto |
| 7,678,197 B2 | 3/2010 | Maki |
| 7,678,715 B2 | 3/2010 | Mungekar et al. |
| 7,682,454 B2 | 3/2010 | Sneh |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,754,621 B2 | 7/2010 | Putjkonen |
| 7,780,440 B2 | 8/2010 | Shibagaki et al. |
| 7,833,353 B2 | 11/2010 | Furukawahara et al. |
| 7,838,084 B2 | 11/2010 | Derderian et al. |
| 7,851,019 B2 | 12/2010 | Tuominen et al. |
| 7,884,918 B2 | 2/2011 | Hattori |
| D634,719 S | 3/2011 | Yasuda et al. |
| 7,939,447 B2 | 5/2011 | Bauer et al. |
| 7,955,516 B2 | 6/2011 | Chandrachood |
| 7,992,318 B2 | 8/2011 | Kawaji |
| 7,998,875 B2 | 8/2011 | DeYoung |
| 8,020,315 B2 | 9/2011 | Nishimura |
| 8,030,129 B2 | 10/2011 | Jeong |
| 8,041,197 B2 | 10/2011 | Kasai et al. |
| 8,043,972 B1 | 10/2011 | Numakura |
| 8,055,378 B2 | 11/2011 | Numakura |
| 8,071,451 B2 | 12/2011 | Uzoh |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,076,251 B2 | 12/2011 | Akae et al. |
| 8,082,946 B2 | 12/2011 | Laverdiere et al. |
| 8,092,604 B2 | 1/2012 | Tomiyasu et al. |
| 8,119,466 B2 | 2/2012 | Avouris |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,267,633 B2 | 9/2012 | Obikane |
| 8,272,516 B2 | 9/2012 | Salvador |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,323,413 B2 | 12/2012 | Son |
| 8,367,528 B2 | 2/2013 | Bauer et al. |
| 8,372,204 B2 | 2/2013 | Nakamura |
| 8,393,091 B2 | 3/2013 | Kawamoto |
| 8,415,258 B2 | 4/2013 | Akae |
| 8,444,120 B2 | 5/2013 | Gregg et al. |
| 8,445,075 B2 | 5/2013 | Xu et al. |
| 8,492,170 B2 | 7/2013 | Xie et al. |
| 8,506,713 B2 | 8/2013 | Takagi |
| D691,974 S | 10/2013 | Osada et al. |
| 8,592,005 B2 | 11/2013 | Ueda |
| 8,608,885 B2 | 12/2013 | Goto et al. |
| 8,617,411 B2 | 12/2013 | Singh |
| 8,633,115 B2 | 1/2014 | Chang et al. |
| 8,664,127 B2 | 3/2014 | Bhatia et al. |
| 8,667,654 B2 | 3/2014 | Gros-Jean |
| 8,668,957 B2 | 3/2014 | Dussarrat et al. |
| 8,683,943 B2 | 4/2014 | Onodera et al. |
| 8,711,338 B2 | 4/2014 | Liu et al. |
| D705,745 S | 5/2014 | Kurs et al. |
| 8,722,510 B2 | 5/2014 | Watanabe et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,841,182 B1 | 9/2014 | Chen et al. |
| D716,742 S | 11/2014 | Jang et al. |
| 8,877,655 B2 | 11/2014 | Shero et al. |
| 8,883,270 B2 | 11/2014 | Shero et al. |
| 8,945,305 B2 | 2/2015 | Marsh |
| 8,945,339 B2 | 2/2015 | Kakimoto |
| 8,956,983 B2 | 2/2015 | Swaminathan |
| 8,986,456 B2 | 3/2015 | Fondurulia et al. |
| 8,993,054 B2 | 3/2015 | Jung et al. |
| 9,005,539 B2 | 4/2015 | Halpin et al. |
| 9,017,481 B1 | 4/2015 | Pettinger et al. |
| 9,018,111 B2 | 4/2015 | Milligan et al. |
| 9,021,985 B2 | 5/2015 | Alokozai et al. |
| 9,023,738 B2 | 5/2015 | Kato et al. |
| 9,029,253 B2 | 5/2015 | Milligan et al. |
| 9,096,931 B2 | 8/2015 | Yednak et al. |
| 9,171,714 B2 | 10/2015 | Mori |
| 9,190,264 B2 | 11/2015 | Yuasa et al. |
| 9,196,483 B1 | 11/2015 | Lee et al. |
| 9,202,727 B2 | 12/2015 | Dunn et al. |
| 9,257,274 B2 | 2/2016 | Kang et al. |
| 9,299,595 B2 | 3/2016 | Dunn et al. |
| 9,324,811 B2 | 4/2016 | Weeks |
| 9,341,296 B2 | 5/2016 | Yednak |

(56) References Cited

U.S. PATENT DOCUMENTS

| | | |
|---|---|---|
| 9,384,987 B2 | 7/2016 | Camilo |
| 9,394,608 B2 | 7/2016 | Jung et al. |
| 9,396,934 B2 | 7/2016 | Shero et al. |
| 9,396,956 B1 | 7/2016 | Tolle |
| 9,404,587 B2 | 8/2016 | Fukazawa |
| 9,412,564 B2 | 8/2016 | Shugrue |
| 9,447,498 B2 | 9/2016 | Milligan |
| 2001/0017103 A1 | 8/2001 | Takeshita et al. |
| 2001/0046765 A1 | 11/2001 | Cappellani et al. |
| 2002/0001974 A1 | 1/2002 | Chan |
| 2002/0001976 A1 | 1/2002 | Danek |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0164420 A1 | 11/2002 | Derderian et al. |
| 2002/0172768 A1 | 11/2002 | Endo et al. |
| 2002/0187650 A1 | 12/2002 | Blalock et al. |
| 2003/0003696 A1 | 1/2003 | Gelatos et al. |
| 2003/0015596 A1 | 1/2003 | Evans |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1 | 5/2003 | Yoshidome et al. |
| 2003/0111963 A1 | 6/2003 | Tolmachev et al. |
| 2003/0121608 A1 | 7/2003 | Chen |
| 2003/0141820 A1 | 7/2003 | White et al. |
| 2003/0143328 A1 | 7/2003 | Chen |
| 2003/0168001 A1 | 9/2003 | Sneh |
| 2003/0180458 A1 | 9/2003 | Sneh |
| 2003/0192875 A1 | 10/2003 | Bieker et al. |
| 2003/0217915 A1 | 11/2003 | Ouellet |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0016637 A1 | 1/2004 | Yang |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0094402 A1 | 5/2004 | Gopalraja |
| 2004/0101622 A1 | 5/2004 | Park et al. |
| 2004/0106249 A1 | 6/2004 | Huotari |
| 2004/0124131 A1 | 7/2004 | Aitchison |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0211357 A1 | 10/2004 | Gadgil |
| 2004/0214399 A1 | 10/2004 | Ahn et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0037610 A1 | 2/2005 | Cha |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0112282 A1 | 5/2005 | Gordon et al. |
| 2005/0120805 A1 | 6/2005 | Lane |
| 2005/0123690 A1 | 6/2005 | Derderian et al. |
| 2005/0173003 A1 | 8/2005 | Laverdiere et al. |
| 2005/0175789 A1 | 8/2005 | Helms |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0251990 A1 | 11/2005 | Choi |
| 2005/0263075 A1 | 12/2005 | Wang et al. |
| 2005/0271813 A1 | 12/2005 | Kher et al. |
| 2005/0282101 A1 | 12/2005 | Adachi |
| 2005/0287725 A1 | 12/2005 | Kitagawa |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1* | 3/2006 | Radhakrishnan ............ 427/569 |
| 2006/0087638 A1 | 4/2006 | Hirayanagi |
| 2006/0107898 A1 | 5/2006 | Blomberg |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0163612 A1 | 7/2006 | Kouvetakis et al. |
| 2006/0177855 A1 | 8/2006 | Utermohlen |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0263522 A1 | 11/2006 | Byun |
| 2006/0266289 A1 | 11/2006 | Verghese et al. |
| 2006/0286818 A1 | 12/2006 | Wang et al. |
| 2006/0291982 A1 | 12/2006 | Tanaka |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0026651 A1 | 2/2007 | Learn et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0066079 A1 | 3/2007 | Kloster et al. |
| 2007/0077355 A1 | 4/2007 | Chacin et al. |
| 2007/0082132 A1 | 4/2007 | Shinriki |
| 2007/0084405 A1 | 4/2007 | Kim |
| 2007/0096194 A1 | 5/2007 | Streck et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0237699 A1 | 10/2007 | Clark |
| 2007/0249131 A1 | 10/2007 | Allen et al. |
| 2007/0252244 A1 | 11/2007 | Srividya et al. |

(56) References Cited

U.S. PATENT DOCUMENTS

| | | |
|---|---|---|
| 2007/0264807 A1 | 11/2007 | Leone et al. |
| 2008/0006208 A1 | 1/2008 | Ueno et al. |
| 2008/0018004 A1 | 1/2008 | Steidl |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0102203 A1 | 5/2008 | Wu |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0142483 A1 | 6/2008 | Hua |
| 2008/0149031 A1 | 6/2008 | Chu et al. |
| 2008/0176375 A1 | 7/2008 | Erben et al. |
| 2008/0179104 A1* | 7/2008 | Zhang .................. B22F 1/0025 175/374 |
| 2008/0202416 A1 | 8/2008 | Provencher |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0242097 A1 | 10/2008 | Boescke et al. |
| 2008/0248310 A1* | 10/2008 | Kim et al. ..................... 428/408 |
| 2008/0257494 A1 | 10/2008 | Hayashi et al. |
| 2008/0261413 A1 | 10/2008 | Mahajani |
| 2008/0282970 A1 | 11/2008 | Heys et al. |
| 2008/0298945 A1 | 12/2008 | Cox |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029503 A1 | 1/2009 | Arai |
| 2009/0029564 A1 | 1/2009 | Yamashita et al. |
| 2009/0035947 A1 | 2/2009 | Horii |
| 2009/0042344 A1 | 2/2009 | Ye et al. |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0130331 A1 | 5/2009 | Asai |
| 2009/0136668 A1 | 5/2009 | Gregg et al. |
| 2009/0139657 A1 | 6/2009 | Lee et al. |
| 2009/0206056 A1 | 8/2009 | Xu |
| 2009/0211523 A1 | 8/2009 | Kuppurao et al. |
| 2009/0211525 A1 | 8/2009 | Sarigiannis et al. |
| 2009/0236014 A1 | 9/2009 | Wilson |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0269941 A1 | 10/2009 | Raisanen |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0090149 A1 | 4/2010 | Thompson et al. |
| 2010/0092696 A1 | 4/2010 | Shinriki |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0159638 A1 | 6/2010 | Jeong |
| 2010/0162752 A1 | 7/2010 | Tabata et al. |
| 2010/0163937 A1 | 7/2010 | Clendenning |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0255658 A1 | 10/2010 | Aggarwal |
| 2010/0275846 A1 | 11/2010 | Kitagawa |
| 2010/0282645 A1 | 11/2010 | Wang |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0027999 A1 | 2/2011 | Sparks et al. |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0117749 A1 | 5/2011 | Sheu |
| 2011/0139748 A1 | 6/2011 | Donnelly et al. |
| 2011/0143461 A1 | 6/2011 | Fish et al. |
| 2011/0183527 A1 | 7/2011 | Cho |
| 2011/0192820 A1 | 8/2011 | Yeom et al. |
| 2011/0198736 A1 | 8/2011 | Shero et al. |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256675 A1* | 10/2011 | Avouris .................. B82Y 10/00 438/197 |
| 2011/0256726 A1 | 10/2011 | LaVoie |
| 2011/0256734 A1 | 10/2011 | Hausmann et al. |
| 2011/0265715 A1 | 11/2011 | Keller |
| 2011/0265725 A1 | 11/2011 | Tsuji |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0032311 A1 | 2/2012 | Gates |
| 2012/0043556 A1 | 2/2012 | Dube et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0263876 A1 | 10/2012 | Haukka et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1 | 12/2012 | Bedell et al. |
| 2012/0321786 A1 | 12/2012 | Satitpunwaycha et al. |
| 2013/0023129 A1 | 1/2013 | Reed |
| 2013/0064973 A1 | 3/2013 | Chen et al. |
| 2013/0068727 A1 | 3/2013 | Okita |
| 2013/0084714 A1 | 4/2013 | Oka et al. |
| 2013/0104988 A1 | 5/2013 | Yednak et al. |
| 2013/0104992 A1 | 5/2013 | Yednak et al. |
| 2013/0105796 A1 | 5/2013 | Liu et al. |
| 2013/0115383 A1 | 5/2013 | Lu et al. |
| 2013/0115763 A1 | 5/2013 | Takamure et al. |
| 2013/0126515 A1 | 5/2013 | Shero et al. |
| 2013/0129577 A1 | 5/2013 | Halpin et al. |
| 2013/0160709 A1 | 6/2013 | White |
| 2013/0168354 A1 | 7/2013 | Kanarik |
| 2013/0203266 A1 | 8/2013 | Hintze |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0269612 A1 | 10/2013 | Cheng et al. |
| 2013/0285155 A1 | 10/2013 | Glass |
| 2013/0288480 A1 | 10/2013 | Sanchez et al. |
| 2013/0292676 A1 | 11/2013 | Milligan et al. |
| 2013/0292807 A1 | 11/2013 | Raisanen et al. |
| 2013/0313656 A1 | 11/2013 | Tong |
| 2013/0330911 A1 | 12/2013 | Huang et al. |
| 2013/0330933 A1 | 12/2013 | Fukazawa et al. |
| 2013/0337583 A1 | 12/2013 | Kobayashi et al. |
| 2013/0340619 A1 | 12/2013 | Tammera |
| 2013/0344248 A1 | 12/2013 | Clark |
| 2014/0000843 A1 | 1/2014 | Dunn et al. |
| 2014/0001520 A1 | 1/2014 | Glass |
| 2014/0014644 A1 | 1/2014 | Akiba et al. |
| 2014/0020619 A1 | 1/2014 | Vincent et al. |
| 2014/0027884 A1 | 1/2014 | Fang et al. |
| 2014/0036274 A1 | 2/2014 | Marquardt et al. |

(56) References Cited

U.S. PATENT DOCUMENTS

| | | |
|---|---|---|
| 2014/0048765 A1 | 2/2014 | Ma et al. |
| 2014/0057454 A1 | 2/2014 | Subramonium |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0103145 A1 | 4/2014 | White et al. |
| 2014/0110798 A1 | 4/2014 | Cai |
| 2014/0120487 A1 | 5/2014 | Kaneko |
| 2014/0141625 A1 | 5/2014 | Fuzazawa et al. |
| 2014/0159170 A1 | 6/2014 | Raisanen et al. |
| 2014/0175054 A1 | 6/2014 | Carlson et al. |
| 2014/0179085 A1 | 6/2014 | Hirose et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0251953 A1 | 9/2014 | Winkler et al. |
| 2014/0251954 A1 | 9/2014 | Winkler et al. |
| 2014/0256156 A1 | 9/2014 | Harada et al. |
| 2014/0346650 A1 | 11/2014 | Raisanen et al. |
| 2014/0363985 A1 | 12/2014 | Jang et al. |
| 2015/0004316 A1 | 1/2015 | Thompson et al. |
| 2015/0014632 A1 | 1/2015 | Kim et al. |
| 2015/0021599 A1 | 1/2015 | Ridgeway |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0111374 A1 | 4/2015 | Bao |
| 2015/0132212 A1 | 5/2015 | Winkler et al. |
| 2015/0140210 A1 | 5/2015 | Jung et al. |
| 2015/0147877 A1 | 5/2015 | Jung |
| 2015/0162214 A1 | 6/2015 | Thompson |
| 2015/0167159 A1 | 6/2015 | Halpin et al. |
| 2015/0179427 A1 | 6/2015 | Hirose et al. |
| 2015/0184291 A1 | 7/2015 | Alokozai et al. |
| 2015/0187568 A1 | 7/2015 | Pettinger et al. |
| 2015/0255324 A1 | 9/2015 | Li et al. |
| 2015/0376211 A1 | 12/2015 | Girard |
| 2016/0013042 A1 | 1/2016 | Hashimoto et al. |
| 2016/0020094 A1 | 1/2016 | Van Aerde et al. |
| 2016/0093528 A1 | 3/2016 | Chandrashekar et al. |
| 2016/0141176 A1 | 5/2016 | Van Aerde et al. |

FOREIGN PATENT DOCUMENTS

| | | |
|---|---|---|
| CN | 101522943 | 9/2009 |
| CN | 101423937 | 9/2011 |
| CN | 102383106 | 3/2012 |
| DE | 102008052750 | 6/2009 |
| EP | 2036600 | 3/2009 |
| JP | 07283149 | 10/1995 |
| JP | 08335558 | 12/1996 |
| JP | 2001-15698 | 1/2001 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| JP | 2012146939 | 8/2012 |
| KR | 20100032812 | 3/2010 |
| TW | I226380 | 1/2005 |
| TW | 200701301 | 1/2007 |
| WO | 2004008827 | 1/2004 |
| WO | 2006/056091 | 6/2006 |
| WO | 2006/078666 | 7/2006 |
| WO | 2009154889 | 12/2009 |
| WO | 2014107290 | 7/2014 |

OTHER PUBLICATIONS

Conversion of metal carbides to carbide derived carbon by reactive ion etching in halogen gas Proceedings of SPIE—The International Society for Optical Engineering (2006), 6223(Micro (MEMS) and Nanotechnologies for Space Applications), 62230J/1-62230J/11 CODEN: PSISDG; ISSN: 0277-786X; English.*

Presser, Volker, et al. "Effect of pore size on carbon dioxide sorption by carbide derived carbon." Energy & Environmental Science 4.8 (2011): 3059-3066.*

USPTO; Office Action dated Aug. 27, 2010 in U.S. Appl. No. 12/118,596.

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

USPTO; Restriction Requirement dated Jan. 15, 2013 in U.S. Appl. No. 12/754,223.

USPTO; Office Action dated Feb. 26, 2013 in U.S. Appl. No. 12/754,223.

USPTO; Final Office Action dated Jun. 28, 2013 in U.S. Appl. No. 12/754,223.

USPTO; Office Action dated Feb. 25, 2014 in U.S. Appl. No. 12/754,223.

USPTO; Office Action dated Apr. 23, 2013 in U.S. Appl. No. 12/763,037.

USPTO; Final Office Action dated Oct. 21, 2013 in U.S. Appl. No. 12/763,037.

USPTO; Restriction Requirement dated Sep. 25, 2012 in U.S. Appl. No. 12/854,818.

USPTO; Office Action dated Dec. 6, 2012 in U.S. Appl. No. 12/854,818.

USPTO; Final Office Action dated Mar. 13, 2013 in U.S. Appl. No. 12/854,818.

USPTO; Office Action dated Aug. 30, 2013 in U.S. Appl. No. 12/854,818.

USPTO; Final Office Action dated Mar. 26, 2014 in U.S. Appl. No. 12/854,818.

USPTO; Restriction Requirement dated May 8, 2013 in U.S. Appl. No. 13/102,980.

USPTO; Office Action dated Oct. 7, 2013 in U.S. Appl. No. 13/102,980.

USPTO; Final Office Action dated Mar. 25, 2014 in U.S. Appl. No. 13/102,980.

USPTO; Restriction Requirement dated Dec. 16, 2013 in U.S. Appl. No. 13/284,642.

USPTO; Restriction Requirement dated Apr. 21, 2014 in U.S. Appl. No. 13/284,642.

USPTO; Office Action dated Jan. 28, 2014 in U.S. Appl. No. 13/312,591.

USPTO; Final Office Action dated May 14, 2014 in U.S. Appl. No. 13/312,591.

USPTO; Office Action dated Jan. 10, 2013 in U.S. Appl. No. 13/339,609.

USPTO; Office Action dated Feb. 11, 2013 in U.S. Appl. No. 13/339,609.

USPTO; Final Office Action dated May 17, 2013 in U.S. Appl. No. 13/339,609.

USPTO; Office Action dated Aug. 29, 2013 in U.S. Appl. No. 13/339,609.

USPTO; Final Office Action dated Dec. 18, 2013 in U.S. Appl. No. 13/339,609.

USPTO; Notice of Allowance dated Apr. 7, 2014 in U.S. Appl. No. 13/339,609.

USPTO; Office Action dated Feb. 13, 2014 in U.S. Appl. No. 13/411,271.

USPTO; Restriction Requirement dated Oct. 29, 2013 in U.S. Appl. No. 13/439,258.

(56) References Cited

OTHER PUBLICATIONS

USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
USPTO; Restriction Requirement dated May 8, 2014 in U.S. Appl. No. 13/791,246.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and HfOxNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 6, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
Portet, et al., "Impact of Synthesis Conditions on Surface Chemistry and Structure of Carbide-Derived Carbons," Thermochimica Acta 497, pp. 137-142, (2010).

(56) References Cited

OTHER PUBLICATIONS

Yushin, et al., "8 Carbon-Derived Carbon," Department of Materials Science and Engineering, Drexel University, Philadelphia, Pennsylvania. (2006).
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Metal Halides on Thermal, Mechanical, and Electrical Properties of Polypyromelitimide Films," Journal of Applied Polymer Science, vol. 32, pp. 3987-4000, (1986).
USPTO; Final Office Action dated Aug. 12, 2015 in U.S. Appl. No. 12/754,223.
USPTO; Non-Final Office Action dated Jun. 17, 2015 in U.S. Appl. No. 13/283,408.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.
USPTO; Notice of Allowance dated May 23, 2016 in U.S. Appl. No. 12/754,223.
USPTO; Non-Final Office Action dated Apr. 7, 2016 in U.S. Appl. No. 13/187,300.
USPTO; Notice of Allowance dated Mar. 28, 2016 in U.S. Appl. No. 13/283,408.
USPTO; Final Office Action dated Jun. 2, 2016 in U.S. Appl. No. 13/597,108.
USPTO; Non-Final Office Action dated May 10, 2016 in U.S. Appl. No. 13/651,144.
USPTO; Non-Final Office Action dated Jun. 15, 2016 in U.S. Appl. No. 13/941,216.
USPTO; Final Office Action dated Apr. 20, 2016 in U.S. Appl. No. 13/791,246.
USPTO; Final Office Action dated Apr. 12, 2016 in U.S. Appl. No. 13/791,339.
USPTO; Restriction Requirement dated May 20, 2016 in U.S. Appl. No. 14/218,690.
USPTO; Notice of Allowance dated Jun. 2, 2016 in U.S. Appl. No. 14/260,701.
USPTO; Final Office Action dated Jun. 17, 2016 in U.S. Appl. No. 14/457,058.
USPTO; Final Office Action dated Apr. 5, 2016 in U.S. Appl. No. 14/498,036.
USPTO; Final Office Action dated May 26, 2016 in U.S. Appl. No. 14/508,296.
USPTO; Notice of Allowance dated Jun. 2, 2016 in U.S. Appl. No. 14/571,126.
USPTO; Notice of Allowance dated May 31, 2016 in U.S. Appl. No. 14/659,437.
USPTO; Non-Final Office Action dated Mar. 30, 2016 in U.S. Appl. No. 14/808,979.
Kobayshi, et al., "Temperature Dependence of $SiO_2$ Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
H.J. Yun et al., "Comparison of Atomic Scale Etching of Poly-Si in Inductively Coupled Ar and He Plasmas", Korean Journal of Chemical Engineering, vol. 24, year 2007, pp. 670-673.
Krenek et al. "IR Laser CVD of Nanodisperse Ge—Si—Sn Alloys Obtained by Dielectric Breakdown of $GeH_4/SiH_4/SnH_4$ Mixtures", NanoCon 2014, Nov. 5-7, Brno, Czech Republic, EU.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden 2015.
Presser, et al., "Effect of Pore Size on Carbon Dioxide Sorption by Carbide Derived Carbon," Energy & Environmental Science 4.8, 3059-3066 (2011).
Radamson et al. "Growth of Sn-alloyed Group IV Materials for Photonic and Electronic Applications", Chapter 5 pp. 129-144, Manufacturing NanoStructures.
S.D. Athavale and D.J. Economou, "Realization of Atomic Layer Etching of Silicon", Journal of Vacuum Science and Technology B, vol. 14, year 1996, pp. 3702-3705.
Yun et al., "Behavior of Various Organosilicon Molecules in PECVD Processes for Hydrocarbon-Doped Silicon Oxide Films," Solid State Phenomena, vol. 124-126, 347-350 (2007).
USPTO; Final Office Action dated Sep. 23, 2016 in U.S. Appl. No. 13/187,300.
USPTO; Non-Final Office Action dated Sep. 15, 2016 in U.S. Appl. No. 13/597,108.
USPTO; Notice of Allowance dated Sep. 13, 2016 in U.S. Appl. No. 13/941,216.
USPTO; Final Office Action dated Sep. 20, 2016 in U.S. Appl. No. 13/651,144.
USPTO; Final Office Action dated Aug. 25, 2016 in U.S. Appl. No. 14/188,760.
USPTO; Non Final Office Action dated Aug. 12, 2016 in U.S. Appl. No. 14/246,969.
USPTO; Non-Final Office Action dated Sep. 8, 2016 in U.S. Appl. No. 14/508,296.
USPTO; Final Office Action dated Sep. 29, 2016 in U.S. Appl. No. 14/568,647.
USPTO; Non-Final Office Action dated Sep. 9, 2016 in U.S. Appl. No. 14/829,565.
USPTO; Non-Final Office Action dated Jul. 29, 2016 in U.S. Appl. No. 14/884,695.

(56) References Cited

OTHER PUBLICATIONS

USPTO; Non-Final Office Action dated Aug. 12, 2016 in U.S. Appl. No. 14/981,434.
USPTO; Non-Final Office Action dated Sep. 23, 2016 in U.S. Appl. No. 15/048,422.
Becker et al., "Atomic Layer Deposition of Insulating Hafnium and Zirconium Nitrides," Chem. Mater., 16, 3497-3501 (2004).
Nigamananda et al., "Low-Temperature (<200° C.) Plasma-Enhanced Atomic Deposition of Dense Titanium Nitride Thin Films."
Potts et al., "Low Temperature Plasma-Enhanced Atomic Layer Deposition of metal Oxide Thin Films," Journal of the Electrochemical Society, 157, 66-74 (2010).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).

\* cited by examiner

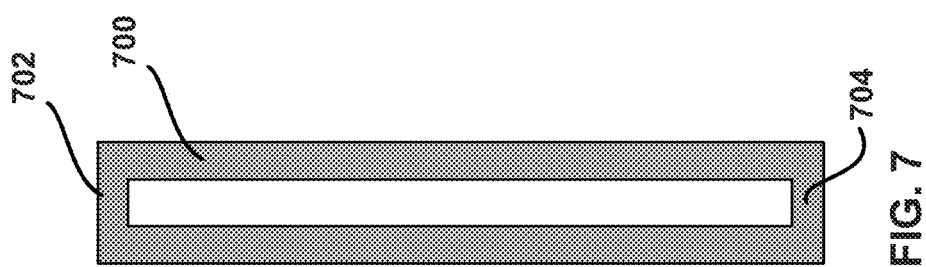
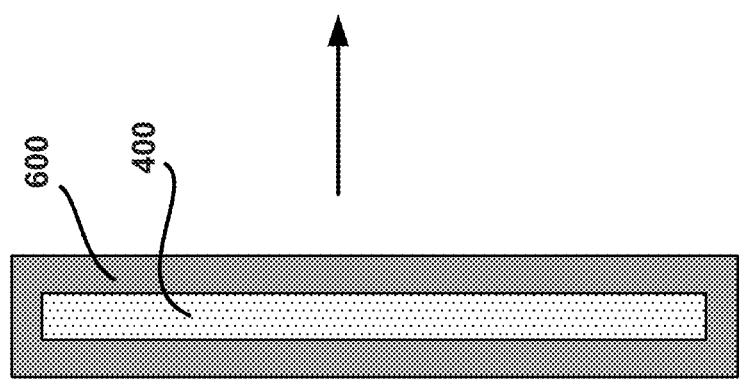
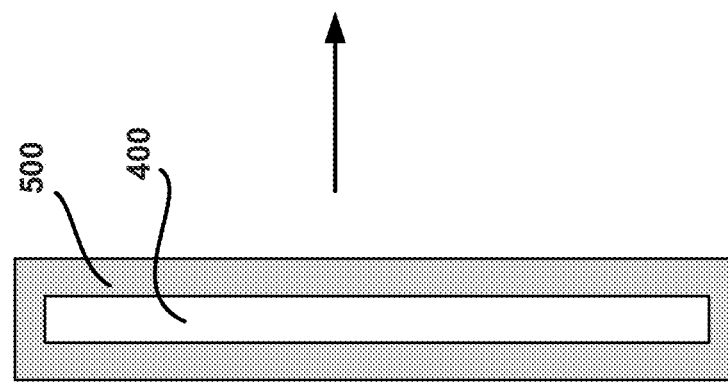
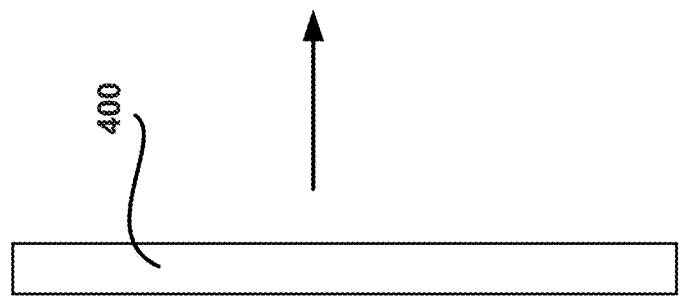

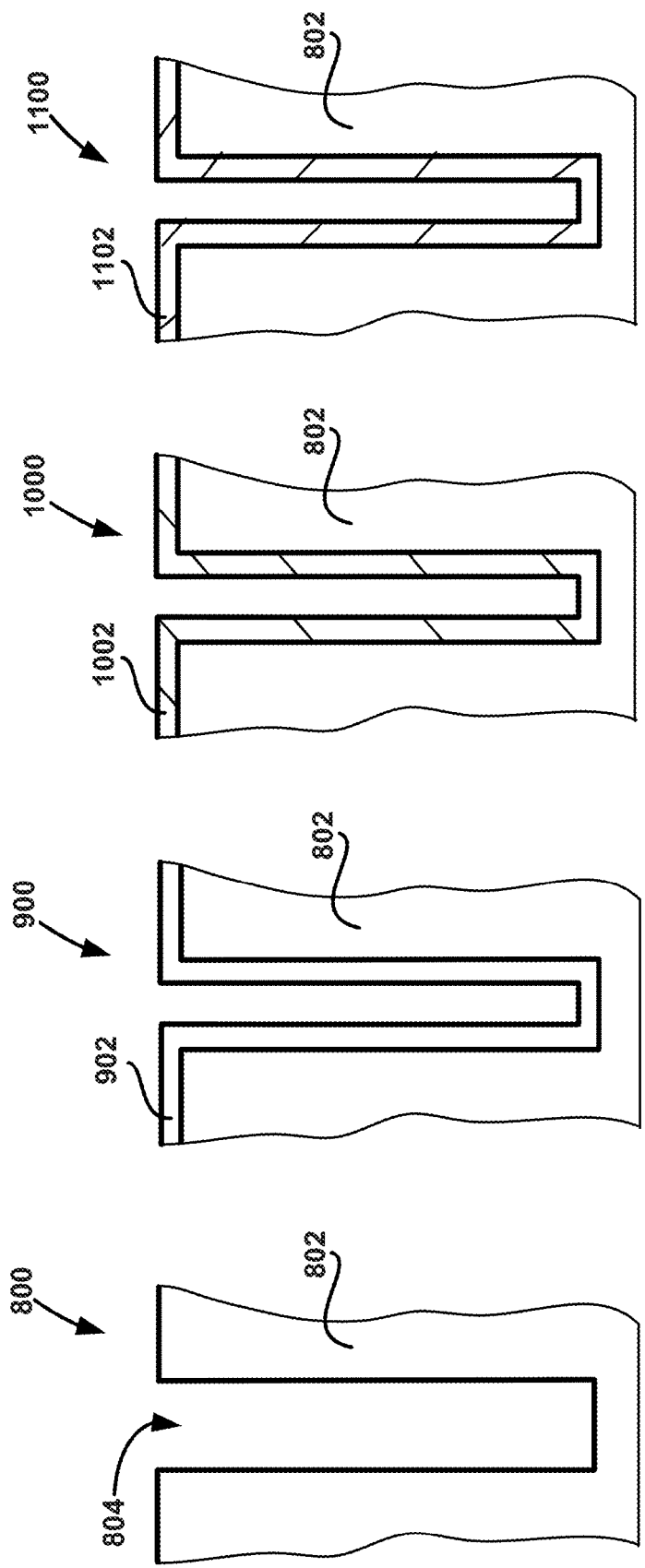

METHOD FOR FORMING CONFORMAL CARBON FILMS, STRUCTURES CONFORMAL CARBON FILM, AND SYSTEM OF FORMING SAME

FIELD OF INVENTION

The present disclosure generally relates to methods and systems for forming carbon films. More particularly, the disclosure relates to methods suitable for forming conformal carbon films, to structures and devices including the carbon films, and to systems for forming the films.

BACKGROUND OF THE DISCLOSURE

Carbon films can exhibit a variety of desirable properties and therefore can be used for a variety of applications. For example, carbon films can be used for electrical energy storage, methane storage, hydrogen storage, as battery components (e.g., as anode material in a lithium-ion cell), as catalyst material or a catalyst support, for coatings, for microelectronic applications (e.g., logic devices, capacitors, or as hard masks), and for carbon nanotube and nanocrystal applications.

The carbon films are typically formed using chemical vapor deposition (CVD) or physical vapor deposition (PVD) techniques. Although such techniques can work relatively well for some applications, it can be relatively difficult to control the structure, morphology, and thickness of the deposited layers. Moreover, typical techniques for depositing carbon are not suitable for forming conformal films over high aspect ratio features.

Recently, techniques have been developed to form carbon films by depositing a metal carbide layer using CVD or PVD techniques and then exposing the metal carbide layer to chlorine or another reactant to remove the metal from the metal carbide film. Such techniques produce carbon films that generally follow the original shape or form of the initial metal carbide film. The CVD and PVD methods used to form the metal carbide films generally suffer from the same deficiencies of typical methods used to deposit carbon films, namely, the thickness of the deposited films is relatively difficult to control, and such techniques do not lend themselves to formation of conformal films, especially when formed overlying high-aspect ratio features. Accordingly, improved methods and systems to form conformal carbon layers and structures and devices including the layers are desired.

SUMMARY OF THE DISCLOSURE

Various embodiments of the present disclosure relate to methods of forming carbon films, structures and devices including the carbon films, and systems for forming the carbon films. While the ways in which various embodiments of the present disclosure address drawbacks of prior techniques for forming carbon films are discussed in more detail below, in general, the present disclosure provides methods of forming conformal carbon films—e.g., over large aspect ratio features on a substrate—with tight control of film thickness over a surface of the substrate.

In accordance with exemplary embodiments of the disclosure, a method of forming a carbon film includes the steps of providing a substrate, depositing, using atomic layer deposition (ALD), a layer of metal carbide onto the substrate, and removing metal from the layer of metal carbide to form a layer of carbon on the substrate. Because the exemplary methods use ALD deposition techniques to deposit the metal carbide, monolayer thickness control of the deposited metal carbide and thus the resulting carbon film can be achieved, even when the carbon films are formed over high aspect ratio features. In accordance with various aspects of these embodiments, the deposited films are at least 80, 90, or 95 percent conformal when deposited over features having an aspect ratio greater than or equal to 10, 15, or 20, and may be conformal to within one monolayer over features having these aspect ratios. In accordance with further aspects of these embodiments, the step of removing metal from the layer of metal carbide includes exposing the metal carbide to a halogen gas that does not etch carbon, such as a gas selected from the group consisting of chlorine, bromine, and iodine. The halogen gas may be exposed to a direct or an indirect plasma or to thermal excitation to form, for example, excited species of chlorine, bromine, and/or iodine. In accordance with yet further aspects of these embodiments, the step of removing metal from the layer of metal carbide can be performed after every deposition cycle of the step of depositing, after a predetermined number of deposition cycles, after a predetermine time, or after a predetermined thickness of the metal carbide layer is deposited. The step of removing metal can be performed in-situ in the same reactor chamber used to deposit the layer of metal carbide—e.g., such that the substrate is not exposed to a vacuum break between the step of depositing and the step of removing. In accordance with yet further exemplary aspects of these embodiments, a duration of the step of removing metal from the layer of metal carbide is determine by monitoring etch products within the reactor chamber and/or by determining an endpoint for the process step. Various examples of these exemplary methods can be used to form thin films of carbon (e.g., 10 monolayers or less, 5 monolayers or less, 2 monolayers, or one monolayer). In accordance with further aspects of these embodiments, the step of depositing includes forming a metal carbide layer at a temperature of about 350° C. or less. In accordance with some exemplary aspects of these embodiments, the substrate is a sacrificial substrate, which is removed after the metal carbide deposition step. In these cases, the method can be used to form, for example, thin-walled carbon nanotubes or similar structures. Exemplary methods can also include an annealing step (e.g., in the presence of nitrogen, hydrogen, and/or ammonia) to alter or transform the structure of the carbon film.

In accordance with additional exemplary embodiments of the disclosure, a structure includes a substrate and a carbon film formed, for example, using atomic layer deposition to deposit a layer of metal carbide onto the substrate and then removing metal from the metal carbide layer. In accordance with exemplary aspects of these embodiments, a thickness of the carbon layer is less than or equal to 10 monolayers, less than or equal to 5 monolayers, less than 2 monolayers, or about one monolayer. The substrate can include features having aspect ratio greater than or equal to 5, greater than or equal to 10, greater than or equal to 15, or greater than or equal to 20. In accordance with various exemplary aspects, the carbon layer is deposed overlying features on the substrate and the carbon layer is at least 80% or at least 90% or at least 95% conformal over the substrate, including the features. In accordance with further aspects, the carbon layer can be substantially amorphous, include carbon nanocrystals, or include ordered graphite structures.

Exemplary structures can be formed using a sacrificial substrate, which is removed or substantially removed during processing. In these cases, the substrate and the carbon film can initially have any of the attributes described above. Structures formed using a sacrificial substrate can include carbon nanotubes or the like.

In accordance with yet further exemplary embodiments of the disclosure, a device includes a structure as described herein. Exemplary devices can include carbon films, e.g., carbon films that are formed as described herein, that can be used to store energy, as low dielectric constant films in semiconductor devices, as carbon hard masks, as wear-resistant layers, or the like.

In accordance with yet additional embodiments of the disclosure, a system includes an atomic layer deposition reactor.

BRIEF DESCRIPTION OF THE DRAWING FIGURES

A more complete understanding of the embodiments of the present disclosure may be derived by referring to the detailed description and claims when considered in connection with the following illustrative figures.

FIGS. 4-6 illustrate steps of forming a carbon layer over a sacrificial substrate in accordance with exemplary embodiments of the disclosure.

FIG. 7 illustrates a carbon nanotube in accordance with further exemplary embodiments of the disclosure.

FIGS. 8-11 illustrate a method of forming a conformal carbon layer overlying a feature on a substrate in accordance with yet additional exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments of methods, structures, devices, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to methods of forming carbon films, to structures and devices including the carbon films, and to systems for forming the carbon films. As set forth in more detail below, carbon films formed in accordance with embodiments of the present disclosure can be used for a variety of applications, including dielectric or capacitor plate layers in microelectronic devices, in energy storage devices, in carbon nanotube applications, as wear-resistant films, as hard masks, and the like.

Figure 1:
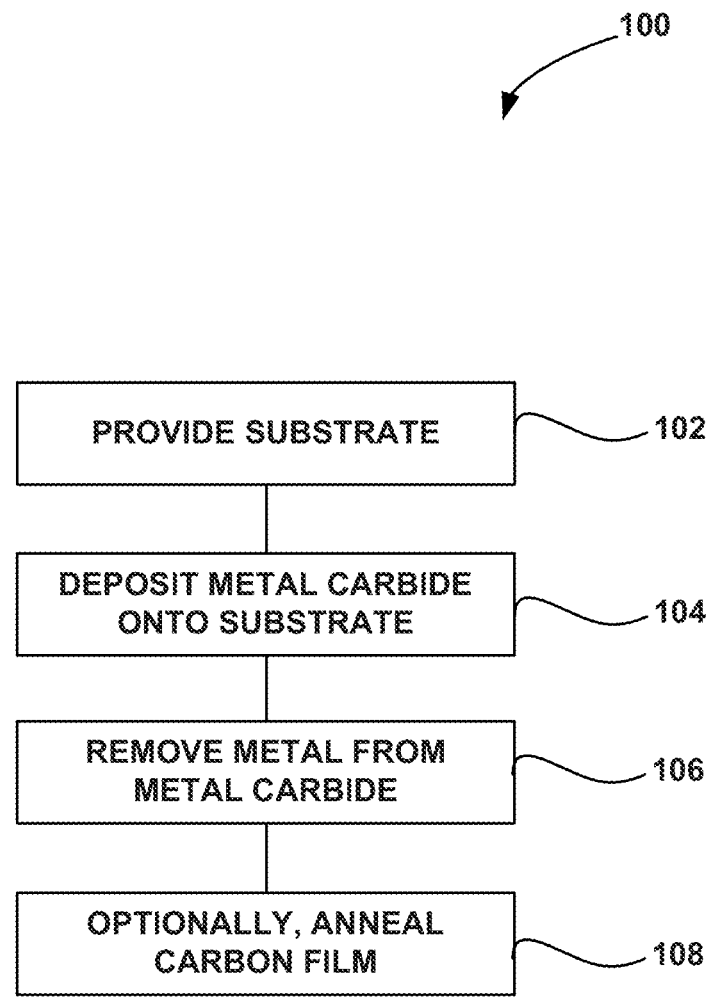
FIG. 1 illustrates a method of forming a carbon film in accordance with exemplary embodiments of the disclosure.

FIG. 1 illustrates a method 100 of forming a carbon film in accordance with exemplary embodiments of the disclosure. Method 100 includes the step of providing a substrate (step 102), depositing a layer of metal carbide onto the substrate (step 104), removing metal from the metal carbide (step 106), and optionally annealing the carbon film (step 108). Method 100 is particularly well suited for forming conformal carbon films overlying a substrate.

During step 102, one or more substrates are provided within a reaction chamber of a reactor, such as a reaction chamber 204, described in more detail below. As used herein, a "substrate" refers to any material having a surface onto which a carbon film can be deposited. A substrate may include a bulk material such as silicon (e.g., single crystal silicon), a sacrificial substrate, such as a ceramic or a polymer, and may include one or more layers overlying the bulk material. Further, the substrate may include various features, such as trenches, vias, lines, and the like formed within or on at least a portion of the substrate. The features can have an aspect ratio, defined as a feature's height divided by the feature's width, of, for example greater than or equal to 5, greater than or equal to 10, greater than or equal to 15, or greater than or equal to 20. Pre-deposition reactor conditions, such as substrate temperature, reaction chamber pressure, and the like can be set at step 102.

At step 104, a metal carbide layer is deposited onto the substrate using atomic layer deposition. Although use of atomic layer deposition may be a relatively slow process for forming metal carbide layers, using atomic layer deposition to deposit the metal carbide has several advantages over prior art techniques to form carbon films. For example, atomic layer deposition allows for relatively conformal deposition of the metal carbide layer over features having the aspect ratios noted above, and reaction temperatures (e.g., substrate temperatures) can be relatively low—e.g., less than 500° C. or less than 350° C. Exemplary carbide layers are greater than or equal to 80 percent conformal over the features, greater than or equal to 85 percent, greater than or equal to 90 percent, greater than or equal to 95 percent or greater than or equal to 99 percent conformal over features having an aspect ratio equal to or greater than 10, 15, and 20.

A thickness of the metal carbide layer deposited during step 104 can vary according to application. By way of examples, less than or equal to 10, less than or equal to 5, less than or equal to 2, or one monolayer can be deposited during step 104. However, the disclosure is not restricted to such number of layers or layer thicknesses, unless otherwise noted.

A variety of metal carbides can be deposited during step 104. By way of examples, the metal carbide film can include one or more of TiAlC, NbC, VC, HfC, ZrC, TaC, MoC, WC, BaC, SrC, SiC, AlC, FeC and ternary mixtures or any combination thereof.

The process conditions during step 104 can vary depending on the metal carbide layer deposited onto the substrate. By way of examples, a temperature during step 104 can range from about 100° C. to about 500° C., or as noted above, be less than 500° C. or less than 350° C., and a pressure can range from about 50 mTorr to about 600 Torr.

After a metal carbide layer is deposited onto a substrate during step 104, metal from the metal carbide layer is removed during step 106. Step 106 can be performed in the same reaction chamber as step 104, e.g., without a vacuum break between steps, or step 106 can be performed in a separate reaction chamber that can be, for example, part of the same cluster tool as the reaction chamber used for step 104. When steps 104 and 106 are performed in the same reaction chamber, steps 104 and 106 can operate at the same or substantially same operating pressure and operating temperature.

A halogen gas that does not etch carbon or significantly etch carbon, such as a gas selected from the group consisting of chlorine, bromine, and iodine, can be used to etch or remove the metal from the metal carbide. The gas, e.g., chlorine, bromine, and/or iodine, can be thermally and/or plasma (direct or remote) activated to increase the activity of the etch reactant gas. In these cases, the etch reactant can include a combination of molecules, radicals and/or ions including, for example, chlorine, bromine, and/or iodine. By way of example, chlorine gas at a flow rate of about 500 sccm, at a pressure of about 1 Torr and a temperature of about 350° C., for a period of about 10 seconds can be used to remove metal from a metal carbide layer having a thickness of about 50 Å.

Step 106 can be performed after a number of ALD cycles performed during step 104 (e.g., 1, 2, 5, 10, 15, 20, or more cycles), after a predetermined thickness of metal carbide is deposited during step 104, or after a predetermined amount of time for step 104. Additionally, method 100 can include repeating steps 104, 106 a desired number of times before proceeding to optional step 108 or to completion.

At optional step 108, the metal-depleted carbon film is exposed to an anneal process to, e.g., alter a structure of the carbon film. By way of examples, step 108 can be performed at a temperature of about 150 degrees C. to about 1200 degrees C. or about 200 degrees C. to about 400 degrees C. in, for example, a nitrogen, hydrogen, and/or ammonia environment or any other suitable reducing environment including hydrazine or hydrazine derivatives. The carbon films can be transformed, for example, from an amorphous structure to a nanocrystalline graphite structure or an ordered graphite structure.

Figure 2:
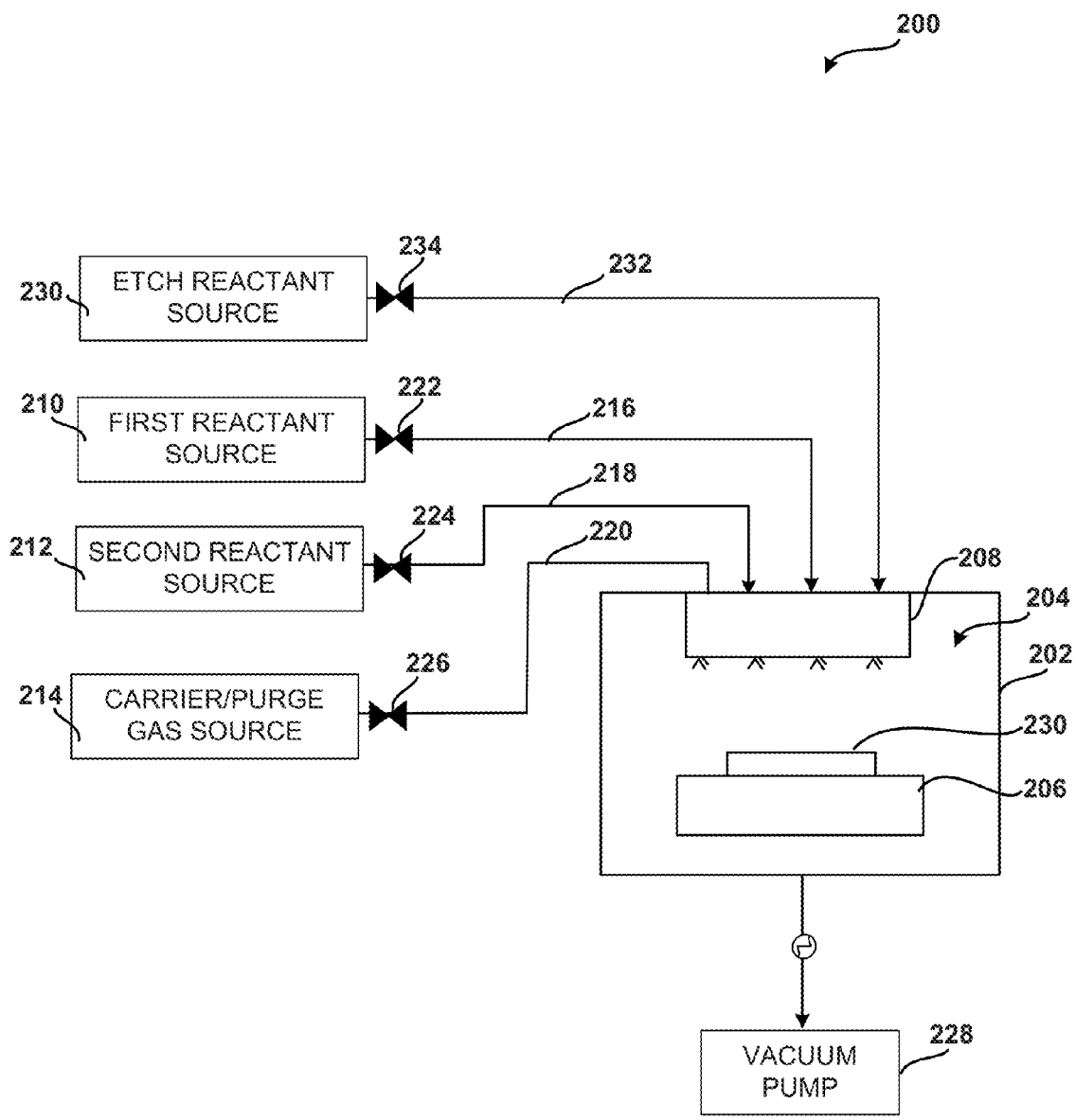
FIG. 2 illustrates a system for forming a carbon film in accordance with exemplary embodiments of the disclosure.

Turning now to FIG. 2, a system 200 for forming a carbon film is illustrated. System 200 includes a reactor 202, including reaction chamber 204, a substrate holder 206, and a gas distribution system 208; a first ALD reactant source 210; a second ALD reactant source 212; a carrier or purge gas source 214; lines 216, 218, 220 connecting sources 210-214 to reactor 202; valves 222, 224 and 226 interposed between the sources 210-214 and reactor 202; etch reactant source 230, coupled to reactor 202 and gas distribution system 208, via a line 232 and a valve 234; and a vacuum source 228.

Reactor 202 may be a standalone reactor or part of a cluster tool. Further, reactor 202 may be dedicated to metal carbide material deposition and optionally a metal removal processes as described herein, or reactor 202 may be used for other processes—e.g., for other layer deposition and/or etch processing. Reactor 202 is a reactor suitable for ALD deposition. An exemplary ALD reactor suitable for system 200 is described in U.S. Pat. No. 8,152,922 to Schmidt et al., issued Apr. 10, 2012, entitled "Gas Mixer and Manifold Assembly for ALD Reactor," the contents of which are hereby incorporated herein by reference, to the extent such contents do not conflict with the present disclosure.

Substrate holder 206 is designed to hold a substrate or workpiece 230 in place during processing. In accordance with various exemplary embodiments, holder 206 may form part of a direct plasma circuit. Additionally or alternatively, holder 206 may be heated, cooled, or be at ambient process temperature during processing.

Although gas distribution system 208 is illustrated in block form, gas distribution system 208 may be relatively complex and designed to mix vapor (gas) from sources 210, 212 and/or 214 and carrier/purge gas from one or more sources, such as gas source 214, prior to distributing the gas mixture to the remainder of reactor 202. Further, system 208 can be configured to provide vertical (as illustrated) or horizontal flow of gasses to reaction chamber 204. An exemplary gas distribution system is described in U.S. Pat. No. 8,152,922.

First reactant source 210 can include any source used to deposit, using ALD, a metal carbide. By way of examples, source 210 can include trimethylaluminum (TMA), triethylaluminum (TEA), or any other suitable metal carbide, transition metal carbide, or other suitable source.

Similarly, second reactant source 212 can include a second reactant used to deposit metal carbide material using ALD. By way of examples, source 212 can include titanium chloride (e.g., $TiCl_4$) or any other suitable source.

Carrier or inert source 214 includes one or more gases, or materials that become gaseous, that are relatively unreactive in reactor 202. Exemplary carrier and inert gasses include nitrogen, argon, helium, and any combinations thereof.

Etch reactant source 230 includes one or more gases, or materials that become gaseous. Source 230 can include any halide that does not etch carbon, such as one or more gasses including for example, chlorine, bromine, iodine or molecules comprising chlorine, bromine and/or iodine. Gas from source 230 may be exposed to a thermal and/or remote plasma and/or direct plasma source to form activated species, such as ions and/or radicals including one or more of chlorine, bromine, and iodine.

Figure 3:
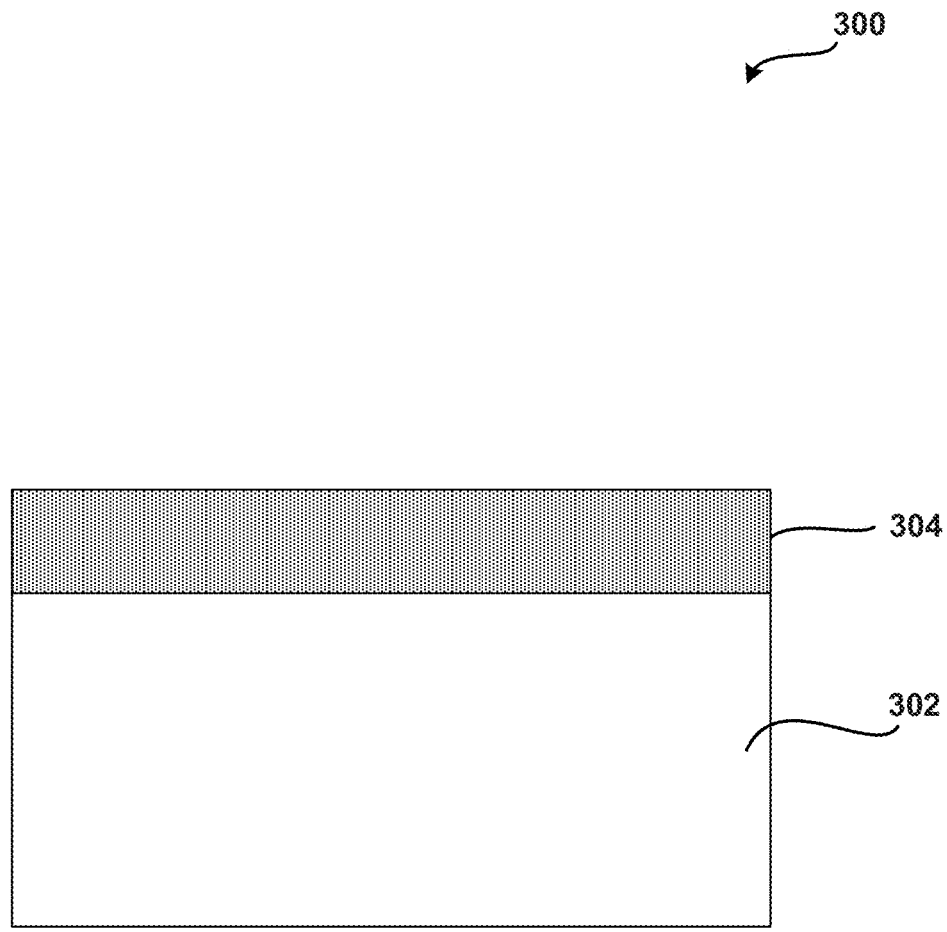
FIG. 3 illustrates a structure including a carbon film in accordance with exemplary embodiments of the disclosure.

FIG. 3 illustrates a structure 300, which can be formed, for example, using method 100 and/or system 200. Structure 300 includes a substrate 302 and a carbon layer 304 formed by using ALD to conformally deposit a metal carbide layer and removing metal from the metal carbide layer. Before an anneal process, layer 304 can include amorphous carbon material. After an anneal process, the layer can transform and include nanocrystalline graphite, ordered graphite, diamond-like structures, fullerenes, or the like. In addition, the optical and/or electrical properties of layer 304 can be transformed during an anneal process to obtain desired properties for layer 304. For example, when layer 304 contains graphite, the layer can be conductive and used to form capacitor plates in microelectronic devices. A monolayer of graphite (graphene) can be used for microelectronic logic and capacitor application.

As noted above, exemplary techniques described herein can be used to form a carbon layer overlying a sacrificial substrate, to form, for example a nanotube 700, illustrated in FIG. 7. A method of forming a carbon layer over a sacrificial substrate is illustrated in FIGS. 4-6. The method begins with providing a sacrificial substrate 400. A layer of conformal metal carbide 500, illustrated in FIG. 5, is then deposited onto sacrificial substrate 400, using for example, the techniques described above with step 104 in connection with FIG. 1.

In this case, the thickness of the metal carbide layer can between about 1 and 10 monolayers or between about 1 and 5 monolayers. Because the metal carbide layer is deposited onto sacrificial substrate 400, a deposition temperature during the step of depositing the metal carbide onto the sacrificial substrate can desirably be relatively low—e.g., less than 500° C., less than 400° C., less than 350° C., or about 100° C. to about 500° C.

A material for sacrificial substrate 400 can vary is accordance with a desired structure for the resulting carbon film. By way of examples, sacrificial substrate material can include polymers or aluminum oxide (e.g., anodic aluminum oxide). Advantageously, utilizing a polymer substrate material can be easily accomplished with sub-250 degree C. process temperatures in accordance with various examples of the present disclosure.

After metal carbide layer 500 is formed overlying sacrificial substrate 400, metal is removed from layer 500 to form a metal-depleted carbon layer 600, illustrated in FIG. 6. The method to remove the metal from layer 500 can be the same or similar to step 106, described above in connection with FIG. 1.

After metal carbide layer 500 is deposited onto sacrificial substrate 400, substrate 400 can be removed—e.g., etched or dissolved. The removing step can occur during the metal removal step or can occur subsequent to the metal removal step, as illustrated in FIGS. 6 and 7 to form nanotube 700. Although illustrated with capped or closed ends 702, 704, nanotube structures in accordance with the present disclosure can have one or more open ends.

Turning now to FIGS. 8-11, a method of forming a structure including a carbon film overlying a high aspect ratio feature is illustrated. The method begins with providing a substrate 802, having a feature 804 having a high aspect ratio, as illustrated in FIG. 8. Substrate 802 can include any of the substrate materials described herein. The aspect ratio of feature 804 can be, for example, greater than or equal to 5, greater than or equal to 10, greater than or equal to 15, or greater than or equal to 20. Although illustrated as a trench or via, substrate 802 can additionally or alternatively include lines or other protrusions having the same or similar aspect ratios.

Structure 900, illustrated in FIG. 9, is formed by depositing a metal carbide film 902 over substrate 802, for example using the method described above in connection with step 104. As noted above, even with aspect ratios of 20 or higher, layer 902, in accordance with exemplary embodiments, is 80 percent, 85, percent, 90 percent, 95 percent, 99 percent or more conformal over the surface of substrate 802, including within feature 804. By way of examples, layer 902 can be conformal to within 2 or to within 1 monolayer of metal carbide material.

Structure 1000 is then formed by removing metal from metal carbide layer 902 to form layer 1002, illustrated in FIG. 10. The metal can be removed using techniques described herein, such as those described in connection with step 106.

Then, structure 1100 is formed by annealing layer 1002 to form restructured carbon layer 1102, illustrated in FIG. 11. Layer 1102 can include graphene, nanocrystalline graphite, or ordered graphite.

Devices, such as microelectronic devices can include a structure as described herein—e.g., structure 300, 700, or 1100. By way of particular examples, a microelectronic device includes structure 1100, wherein layer 1102 can form a capacitor plate or a dielectric layer. Alternatively, an energy storage device includes an exemplary structure as described herein.

Although exemplary embodiments of the present disclosure are set forth herein, it should be appreciated that the disclosure is not so limited. For example, although the system and method are described in connection with various specific chemistries, the disclosure is not necessarily limited to these examples. Further, although methods are illustrated in a particular sequence, the method is not limited to such sequence of steps, unless indicated herein to the contrary. Various modifications, variations, and enhancements of the system and method set forth herein may be made without departing from the spirit and scope of the present disclosure.

The subject matter of the present disclosure includes all novel and nonobvious combinations and subcombinations of the various processes, systems and configurations, and other features, functions, acts, and/or properties disclosed herein, as well as any and all equivalents thereof.

I claim:

1. A method of forming a carbon film, the method comprising the steps of:
   providing a substrate;
   depositing, using atomic layer deposition (ALD), a first layer of metal carbide onto the substrate;
   in a reaction chamber having a pressure in the range of about 50 mTorr to about 600 Torr and having a temperature less than 500° C., removing by etching metal from the layer of metal carbide to form a layer of carbon on the substrate,
   wherein the step of removing metal is performed after one or more ALD cycles to form the layer of carbon and the method further comprises a step of depositing, using ALD, a second layer of metal carbide over the layer of carbon.

2. The method of forming a carbon film of claim 1, wherein the step of providing a substrate comprises providing a substrate comprising features having an aspect ratio greater than or equal to 10.

3. The method of claim 2, wherein the aspect ratio is greater than or equal to 15.

4. The method of claim 1, wherein the step of providing a substrate comprises providing a sacrificial substrate.

5. The method of claim 1, wherein the step of removing metal comprises exposing the metal carbide to one or more halogen gases selected from the group consisting of chlorine, bromine and iodine.

6. The method of claim 1, wherein the step of removing metal comprises exposing the metal carbide to a plasma excited species containing one or more of plasma-excited chlorine, plasma-excited bromine and plasma-excited iodine.

7. The method of claim 1, wherein the temperature is less than 350° C.

8. The method of claim 1, wherein the step of removing metal is performed after 20 or more ALD cycles.

9. The method of claim 1, wherein the step of depositing and the step of removing metal by etching are performed in the same reaction chamber without breaking vacuum between the steps.

10. The method of claim 1, wherein a duration of the step of removing is determined by monitoring an endpoint for the removing metal step.

11. The method of claim 1, wherein a duration of the step of removing is determined by monitoring etch products during the step of removing metal.

12. The method of claim 1, wherein the step of depositing the first layer comprises depositing ten monolayers or less of the metal carbide.

13. The method of claim 1, further comprising a step of exposing the layer of carbon to an anneal process after the step of removing metal from the layer of metal carbide.

14. The method of claim 13, wherein the anneal process is performed in an environment comprising one or more gases selected from the group consisting of nitrogen, hydrogen, ammonia, hydrazine and hydrazine derivatives.

15. The method of claim 13, wherein a structure of the layer of carbon is transformed during the anneal process.

16. The method of claim 2, wherein the aspect ratio is greater than or equal to 20.

17. The method of claim 1, wherein the step of removing is performed after each ALD cycle.

18. The method of claim 13, wherein a temperature during the anneal process ranges from about 150° C. to about 1200° C.

19. The method of claim 13, wherein a temperature during the anneal process ranges from about 200° C. to about 400° C.

20. The method of claim 5, wherein the one or more halogen gases are exposed to a direct plasma, an indirect plasma, or a thermal excitation.

\* \* \* \* \*

UNITED STATES PATENT AND TRADEMARK OFFICE
CERTIFICATE OF CORRECTION

PATENT NO. : 9,605,343 B2  
APPLICATION NO. : 14/079302  
DATED : March 28, 2017  
INVENTOR(S) : Jereld Lee Winkler Page 1 of 1

It is certified that error appears in the above-identified patent and that said Letters Patent is hereby corrected as shown below:

On the Title Page

Item (54) and in the Specification, Column 1 Lines 1-4 should be corrected to read:
METHOD FOR FORMING CONFORMAL CARBON FILMS, STRUCTURES AND DEVICES INCLUDING A CONFORMAL CARBON FILM, AND SYSTEM OF FORMING SAME Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*